US005773920A

United States Patent [19]

Shaw et al.

[11] Patent Number: 5,773,920

[45] Date of Patent: Jun. 30, 1998

[54] GRADED ELECTRON AFFINITY SEMICONDUCTOR FIELD EMITTER

[75] Inventors: Jonathan L. Shaw, Springfield, Va.; Kevin Jensen, Kensington, Md.; Henry F. Gray, Alexandria, Va.

[73] Assignee: The United States of America as represented by the Secretary of the Navy, Washington, D.C.

[21] Appl. No.: 498,266

[22] Filed: Jul. 3, 1995

[51] Int. Cl.[6] ........ H01L 31/00

[52] U.S. Cl. ........ 313/309; 313/351; 313/336; 313/366; 357/55; 357/68

[58] Field of Search ........ 313/311, 542, 313/309, 346 R; 257/4, 9, 10, 103, 52, 37, 49; 315/169.3, 169.4

[56] References Cited

U.S. PATENT DOCUMENTS

| | | | |
|---|---|---|---|
| 4,307,507 | 12/1981 | Gray et al. | 29/580 |
| 4,542,256 | 9/1985 | Wiedeman | 136/249 |
| 4,766,340 | 8/1988 | van der Mast et al. | 313/366 |
| 5,057,047 | 10/1991 | Greene et al. | 445/24 |
| 5,150,192 | 9/1992 | Greene et al. | 357/68 |
| 5,188,977 | 2/1993 | Stengl et al. | 437/89 |
| 5,283,501 | 2/1994 | Zhu et al. | 313/346 R |
| 5,369,289 | 11/1994 | Tamaki et al. | 257/103 |
| 5,371,382 | 12/1994 | Venkatesan et al. | 257/52 |
| 5,404,032 | 4/1995 | Sawanda et al. | 257/192 |

*Primary Examiner*—Sandra L. O'Shea
*Assistant Examiner*—Joseph Williams
*Attorney, Agent, or Firm*—Thomas E. McDonnell; Chester Jordan; Dan Kalish

[57] ABSTRACT

A field emitter is disclosed comprising a graded electron affinity surface layer. The graded electron affinity layer provides for increased transconductance, reduced energy distribution of emitted electrons, reduced noise and increased uniformity in its operation.

17 Claims, 5 Drawing Sheets

PRIOR ART

GRADED ELECTRON AFFINITY SEMICONDUCTOR FIELD EMITTER

BACKGROUND OF THE INVENTION

The present invention relates to a field emission electron source, and more particularly to a field emission electron source incorporating materials in a novel way resulting in significantly different emission physics and significantly improved emission properties.

Electron emission may be induced in a number of ways, including those means conventionally described as thermionic emission, photoelectric emission, secondary emission, emission from negative electron affinity surfaces, Schottky field emission, cold field emission, thermal-field emission, and other combination mechanisms. Cold field emission is a process in which electrons are extracted from a condensed conductive material serving as a field emitter into vacuum by a process of quantum mechanical tunneling; the tunneling probability is increased by the application of positive electric potential to additional conductive structures distal to the field emitter, and by the formation of a sharp point or edge on the emitter, so as to produce a large electric field (typically 1–5×$10^7$ Volts/centimeter) at the apex of the pointed emitter. This electric field reduces the potential energy barrier to tunneling by two mechanisms: one being the change in the vacuum level due to the electric field (which is typically approximated as a linear function of distance from the surface), the other being the image charge effect (which is typically approximated as inversely proportional to the distance from the surface). The sum of the potentials due to the image charge and the electric field reduce both the thickness and height of the potential energy barrier at the surface of the field emitter. At points on the emitter surface where the electric field has sufficient intensity, the potential barrier becomes small enough to increase the probability of tunneling through the barrier to significant levels. The product of the charge density at each point on the surface and the tunneling probability at that point give the emission current density at that point.

Schottky field emission is similar to cold field emission in that a large field is induced at the surface of the emitter; however, the field is not as large as in cold field emission, and does not cause tunneling. Nevertheless, the field serves to reduce the work function of the surface. Emission occurs in much the same manner as in thermionic emission, in which electrons with energies greater than the work function of the surface are generated by heating the emitter. These energetic electrons escape into vacuum classically at the points near the sharp apex where the work function is reduced by the field.

Thermal-field emission is a combination of Schottky emission and cold field emission, in that electrons escape both by quantum mechanical tunneling and by classical emission.

The present invention may be described as an improved "field emitter", where the term "field emitter" is used in the same sense as in the terms "Schottky field emitter" and "thermal-field emitter"; that is, an intense electric field is induced at the emitter surface and is required for emission. The term does not imply that emission necessarily takes place by tunneling, or that the current-voltage characteristic follows any particular relationship. In some embodiments of the present invention, the emission process may take place by tunneling, or by classical emission, or both; and the current-voltage characteristic may be similar to or different from prior art cold field emitters or Schottky field emitters. In the present invention, the energy of electrons within the field emitter is increased by their interaction with the electric field; that is, energy is supplied to the electrons by the voltage source(s) connected between the field emitter and at least one of the additional conductive structures in the external circuit.

It is believed that the current produced by cold field emission follows the functional form of the Fowler-Nordheim equation, which gives the current density as a function of electric field near the surface, or of the voltage applied to an extraction electrode where a linear relationship is assumed to exist between the voltage and the field. The voltage derivative of this relationship gives the transconductance. This derivative shows that the transconductance is a linear function of the current density produced at the emission site of the field emitter. Emission current densities in excess of approximately $10^8$ Ampere/centimeter$^2$ (A/cm$^2$) produce significant space charge, i.e., a concentration of free electrons between the field emission tip and remote electrode sufficient to reduce the field at the emitter surface due to a given voltage applied to an extraction electrode. Because of this effect the field near the emitting surface is no longer a linear function of the voltage applied to the extraction electrode, and hence the current-voltage characteristic of a cold field emitter may deviate from the Fowler-Nordheim relationship. When this happens the transconductance is reduced, hence it is not possible to obtain arbitrarily large transconductance merely by increasing the emission current. Furthermore, the presence of space charge and/or other effects associated with high emission current density may cause sudden failures or gradual degradation of field emitter sources.

The transconductance at a given current density (below that current density which gives rise to space charge) can be increased by reducing the work function; however, low work function materials are typically reactive, and hence special processing and extremely clean conditions are required both to prepare and maintain the low work function surfaces.

Tunneling is a short range (approximately 10 Å) process and hence is very sensitive to surface properties and structure which vary on a scale of Angstroms. These properties can change with time upon adsorption and desorbtion of gases at the emitting surface. Thus when atoms adsorb, desorb, or move over an emitting surface, the current density and transconductance of the emitter may change. Hence cold field emission from surfaces where these processes are occurring tends to be noisy and non-uniform. Adsorption can be reduced by cleaning all surfaces within the evacuated device; however, the need for special processing to achieve such clean surfaces hinders the commercial entrance of devices using field emission sources.

Large numbers of individual field emitters can be microfabricated with integrated extraction electrodes wherein each emitter has a scale of microns or nanometers. An array of these microfabricated field emitters is called a field emitter array (FEA) and is disclosed in U.S. Pat. Nos. 5,057,047 ('047), 5,150,192 ('192), and 4,307,507 ('507), all of which are herein incorporated by reference.

The advent of commercially manufacturable FEAs is likely to stimulate a variety of new devices employing field emitter array electron sources, including flat panel displays and high frequency amplifiers. The attraction of FEAs for commercial applications is derived from their small size, the low voltage needed to modulate (switch) their emitted current, their high current density, and their low manufacturing cost.

Because FEAs are relatively small, the extraction voltage needed to produce significant field emission electron currents is much lower than that of conventional field emission electron sources. Because the extraction voltage is low, the power needed for current modulation may also be relatively low, making high frequency device applications more advantageous.

Field emitter arrays generally use cold field emission sources, since heating the array is not desirable in most applications, and since operating the field emitter arrays at excessive temperature (above 600–800° C.) would degrade the performance of the field emitter array by increasing the leakage current across the isolator between the base of the field emitter and the extraction electrode, sometimes referred to as a gate.

OBJECTS OF THE INVENTION

Accordingly, it is an object of the present invention to provide a field emission electron source having increased transconductance at modest emission current densities not exceeding $10^8$ A/cm$^2$.

Another object of the present invention is to provide a field emission electron source having an operation that manifests reduced noise and increased uniformity.

A further object of the present invention is to provide a field emission electron source having a narrower range of emitted electron energies.

A still further object of the present invention is to provide a field emission electron source having increased protection against excessive emission current.

SUMMARY OF THE INVENTION

The present invention is directed to a field emission electron source finding many applications including high frequency devices and flat panel displays, and having improved transconductance, increased uniformity, decreased noise in its operation, reduced energy distribution, and protection against excessive emission current.

Regarding the use herein of the term "electron affinity," the electron affinity is normally thought of as a quantity specific to a surface, i.e. the energy distance between the conduction band minimum and the vacuum level at the surface. One may think of the energy difference between the conduction band minimum and the vacuum level at points inside the semiconductor as the electron affinity at those points as well. This visualization is used herein in the description of this invention.

The field emitter comprises a substrate structure and a surface layer on top of the substrate. The substrate is conductive, provides an electrical contact to the surface layer, and may provide a sharp structure. The surface layer has a selected thickness and a composition selected to provide a variation of its electron affinity throughout its thickness. The variation of the electron affinity within the surface layer will in general produce a positive electron affinity gradient at some points between the substrate and the surface, such that the electrons moving from the substrate to the surface at the conduction band minimum will gain energy with respect to the vacuum level.

BRIEF DESCRIPTION OF THE DRAWINGS

These and other objects, features and advantages of the present invention, as well as the invention itself, will become better understood by reference to the following detailed description when considered in connection with the accompanying drawings, wherein like reference numbers designate identical or corresponding parts throughout the several views, and wherein.

DETAILED DESCRIPTION

Figure 1A:
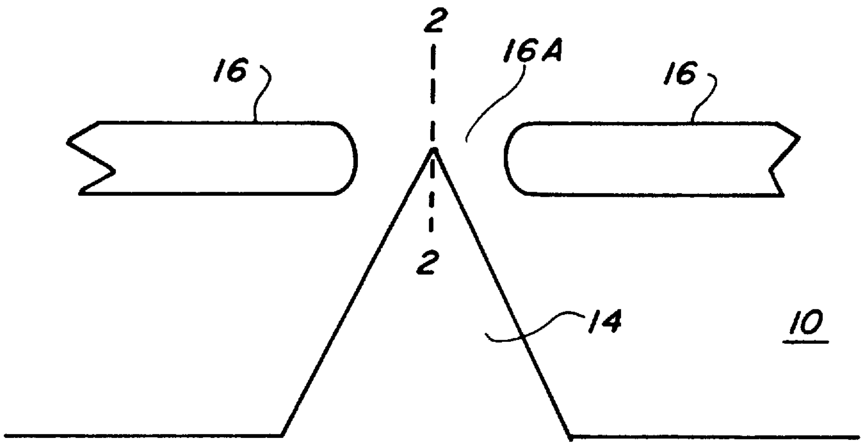
PRIOR ART FIG. 1(A)
FIG. 1 is composed of FIGS. 1(A) and (B) which respectively illustrate the structure of a prior art field emitter and a field emitter of the present invention.

The structure of a field emitter 10 according to prior art may be described with reference to FIGS. 1(A) and 2. The field emitter 10 is composed of a sharp field emitter structure 14 having its apex positioned in an aperture 16A formed by an extraction electrode 16 (partially shown). Further details of the structure of the field emitter 10 according to prior art are not needed for an understanding of the present invention, but reference may be made to Robert Gomer, "Field Emission and Field Ionization," American Institute of Physics, New York (1993) for further teachings thereof. The material comprising sharp field emitter structure 14 may be metallic, semiconducting, or resistive. FIG. 2 generally illustrates the potential energies within the field emitter 14 in the special case where the emitter 14 is a semiconducting material. The horizontal direction in FIG. 2 corresponds to the vertical direction marked by the line 2—2 in FIG. 1(A). The region illustrated in FIG. 2 corresponds to a small region (approximately 100 Å) at the apex of field emitter 14.

Figures 2A, 2B, 2C, 3A, 3B, 3C:
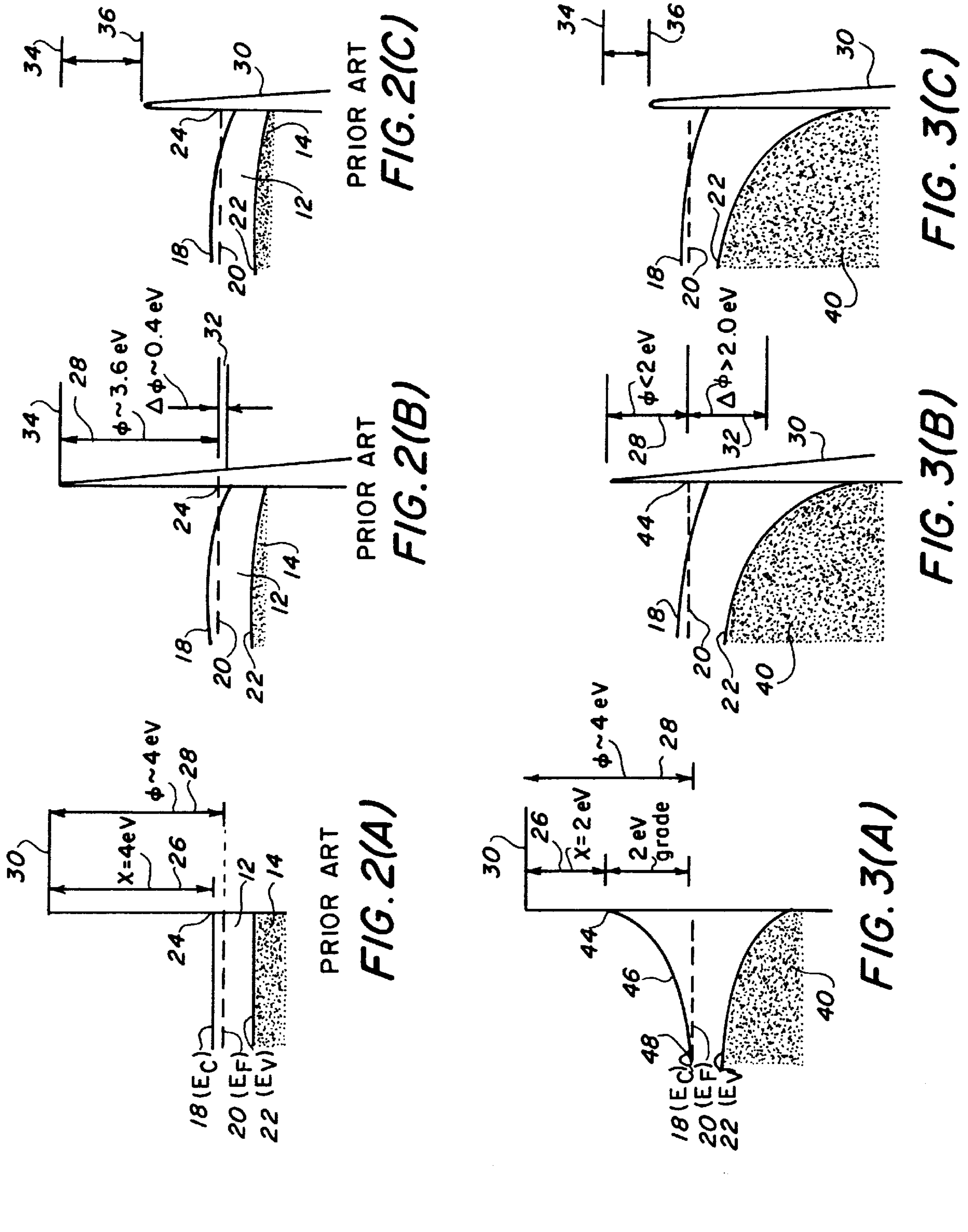
FIG. 2(A) PRIOR ART
FIG. 2(B) PRIOR ART
FIG. 2 is composed of FIGS. 2(A), (B) and (C) which are schematic illustrations of the potential energy profiles of a prior art semiconductor field emitter. The horizontal direction in FIG. 2 corresponds to the line 2—2 of FIG. 1(A).
FIG. 3 is composed of FIGS. 3(A), (B) and (C) which are schematic illustrations of the potential energy profiles of the field emitter of the present invention. The horizontal direction in FIG. 3 corresponds to the line 3—3 of FIG. 1(B).

FIG. 2 is composed of FIGS. 2(A), (B) and (C) which are schematic illustrations of the potential energy profiles at the surface of a prior art semiconductor field emitter 14. FIG. 2 illustrates the field emitter 14 as having parameters, all known in the art, of a band gap 12, conduction band minimum energy ($E_c$) 18, Fermi energy ($E_F$) 20, also referred to as the chemical potential, and valence band maximum energy ($E_v$) 22. FIG. 2 employs the convention that the Fermi level 20 is considered flat. FIG. 2 also illustrates the field emitter 14 as having a surface 24 which is near the apex of the field emitter structure 14 as shown in FIG. 1(A). FIG. 2 further illustrates an electron affinity ($\chi$) 26 having a typical value of approximately 4 eV, as shown in FIG. 2(A). The electron affinity 26 is a measurement of the minimum energy required in zero applied field to bring an electron from the conduction band 18 of a semiconductor material, and have it be emitted or launched into space. Alternatively, the electron affinity 26 may be defined as the difference between the vacuum level at the surface and the conduction band minimum ($E_c$) 18 as shown in FIG. 2(A). FIG. 2 further illustrates a work function 28($\phi$) which is the energy difference between a vacuum level 30 and the Fermi level 20. The Fermi level 20 may lie above or below the conduction band 18 depending on the amount of doping and due to band bending as discussed further below. Therefore, the work function 28($\phi$) of a semiconductor may be less than or greater than the electron affinity 26 ($\chi$). The Fermi energy ($E_F$) 20 is shown in FIG. 2(*a*) lying just below the conduction band minimum ($E_c$) 18 as is typical for n-type silicon.

FIG. 2 illustrates the profile in space of the minimum potential an electron may have in vacuum, or vacuum level 30. The electric field is generated by applying positive charge to an electrode (not shown) distal to the surface of the field emitter 14. FIG. 2(A) illustrates that in the absence of applied electric field, the vacuum level 30 and the conduction and valence bands 18 and 22, respectively, are flat and horizontal.

If a sufficiently large potential is applied to the extraction electrode 16, electrons (not shown) are attracted to the surface 24, having the effect of gradually screening the electric field and bending down the band 18 relative to the Fermi energy as shown in FIG. 2(B). The charge that accumulates in the surface region 24 and screens the electric field also serves to limit the band bending. FIG. 2(B) does not include the image charge effect, discussed further below. Because of the accumulation of electrons at the surface 24, the conduction band ($E_c$) 18 at the surface 24 is lower than the Fermi energy ($E_F$) 20. For example, for silicon, a field at the surface of $1\text{–}5\times10^7$ Volts/cm (V/cm) would cause the conduction band ($E_c$) 18 to fall approximately 0.4 eV below the Fermi energy ($E_F$) 20, as shown by distance 32. Since the electron affinity of silicon is 4 eV, the resulting work function is now 3.6 eV.

Referring now to FIG. 2(C), an additional potential, known as the "image" potential is seen by electrons in the vacuum near the surface. This image potential varies inversely with distance from the surface 24. The work function is reduced by the image potential, illustrated in FIG. 2(C) as the energy difference 34 to 36, where the line 34 references the vacuum level at the surface in zero applied field. Thus, the height of the potential barrier is reduced by the image effect as illustrated by the distance 34–36. The vacuum level 30, illustrated as a straight line in FIG. 2(B), is rounded near the surface 24, and the sum of the vacuum potential shown in FIG. 2(B) and the image potential creates the vacuum potential 30 as illustrated in FIG. 2(C). The potential energy peak, or work function $\phi$, is reduced due to the image potential. The magnitude of the reduction depends on the field, but is typically no larger than 3 eV. If the reduction were to exceed the zero field value of the work function, the tunneling potential barrier would vanish. Such conditions do not occur in prior art devices but may occur in the present invention, for example as described hereinafter with reference to FIG. 5.

Figure 1B:
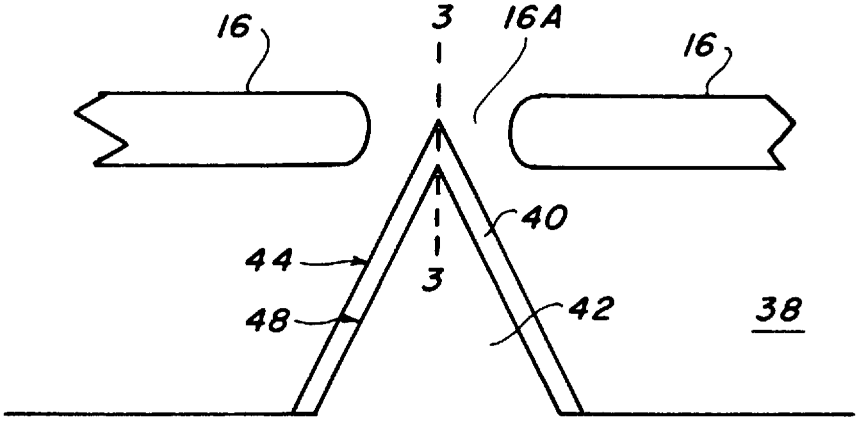

The structure of a field emitter 38 of the present invention may be described with reference to FIG. 1(B). FIG. 1(B) schematically illustrates a field emitter 38 including a surface layer 40 covering substrate structure 42. The horizontal direction in FIG. 3 corresponds to the vertical direction marked by the line 3—3 in FIG. 1(B). The region illustrated in FIG. 3 corresponds to a thin region (approximately 100 Å) at the apex of field emitter surface layer 40.

FIG. 3 is similar to FIG. 2 and where applicable uses the same reference numbers to identify similar elements. As with FIG. 2, FIG. 3 employs the convention that the Fermi level 20 is considered flat. FIG. 3 is composed of FIGS. 3(A), (B) and (C) which are schematic illustrations of the potential energy profiles within a field emitter 38 of the present invention. The potential energy profiles of FIGS. 3(A), (B) and (C) are similar to and directly comparable against those of FIGS. 2(A), (B) and (C). The field emitter surface layer 40 (FIG. 3) also has a surface 44 similar to the surface 24 of the field emitter 14 (FIG. 2). The thickness of the surface layer 40 may typically vary from about 50 Å to about 500 Å.

As seen in FIG. 3(A), the surface layer 40 has a conduction band minimum energy 18 that changes from a typical value of approximately 4 eV near the substrate interface 48, to a lower value at the surface 44, with smooth, upwardly sloping transition 46. The minimum value of the electron affinity does not necessarily occur at the surface 44. The electron affinity at the substrate interface should preferably match the electron affinity (or work function for metal substrate) of the substrate structure 42 in order to facilitate electron transfer across this interface. The variation of the electron affinity is preferably in accordance with a mathematical relationship which may be a linear, quadratic, exponential or otherwise as designed. The invention may also be effective even if the precise electron affinity variation is not known. The range of electron affinity values is typically within the range from about 5 eV to about 0 eV. This variation of the electron affinity with distance through the surface layer 40 is interchangeably referred to herein as an electron affinity profile.

In the operation of the field emitter 38 of FIG. 1(B), both the surface charge density and the tunneling potential barrier (to be further described with reference to FIG. 4) are strongly dependent on the intensity of the electric field in the graded electron affinity layer 44. This causes the emission characteristic to be other than described by the Fowler-Nordheim relationship, and allows for the design of various emission characteristics particularly suited for different applications (such as discussed in the background section above). Such characteristics may include a reduced modulation voltage, a reduced turn-on voltage, improved emission uniformity, reduced energy distribution, and limited maximum emission current, or current density. The particular application will determine which of these characteristics is to be selected.

When there is a zero surface electric field (FIG. 3(A)), there is no free charge near the surface 44 of the graded electron affinity layer 40. However, when a positive voltage is applied to the extraction electrode 16 (FIG. 1), a field is developed across the graded electron affinity layer 40, bending the conduction band 18 downward, as seen in FIGS. 3(B) and (C), and attracting free electrons from the substrate 42 (FIG. 1(B)) toward the surface 44. At the same time, the work function is reduced by the image charge effect as illustrated in FIG. 3(C). Thus when the charge density at the surface becomes significant, the potential barrier is small, and large emission currents are realized. In such operations, at moderate applied fields there may be a zero charge density at the surface 44 and zero emitted current, whereas at only slightly higher applied fields the emission current may become large. For other applications, the electron affinity gradient can be made low, in which case field emission will occur at much lower fields than would be required otherwise. In this configuration the transit time is increased; however, this increase may not be a drawback for many applications such as flat panel displays where reduced voltage operation is paramount.

The substrate generally indicated by reference number 42 may be of a suitable material on which the layer 40 is deposited or formed. The substrate 42 may be of a semiconducting or other conductive material. The surface layer 40 formed of a semiconducting material may include alloys deposited on the substrates 42 by any of a variety of techniques.

Overall Operation Of The Field Emitter Of The Present Invention

The present invention is related to field emission electron sources comprising a substrate plus a semiconductor surface layer which is fabricated in a manner such that the electron affinity of the semiconductor is changed with the distance from the surface in a continuous or stepwise continuous manner, thereby changing the emission properties of the device. The composition of the surface layer may be adjusted to change the shape of the electron affinity profile with distance below the surface and/or with distance from the tip apex of the field emitter in a number of ways, corresponding to desired emission properties.

The present invention shifts some or all of the potential barrier normally present in vacuum at the surface into the semiconductor near the surface. The surface layer constituting this portion of the potential barrier is herein termed the "graded electron affinity layer." The emission current is controlled by a combination of the electron transport process in the graded electron affinity layer, the charge density which accumulates near the surface, and the tunneling probability at the surface. If the surface electron affinity is selected to be relatively high and the electron affinity gradient in the surface layer is not too large, the tunneling probability still controls the emitted current density as in a traditional cold field emitter. If the surface electron affinity is selected to be low, and the electron affinity gradient in the layer is selected to be large, the electron transport process within the graded electron affinity layer will control the emission current completely. If the surface electron affinity is selected so that the tunneling potential barrier remains positive but becomes very low at the surface field where charge first appears at the surface, then the emission current is controlled by a combination of the electron transport process and the tunneling probability.

Detailed Operation Of The Field Emitter Of The Present Invention

To confirm the expected behavior of the potential profiles and charge densities in the graded electron affinity layer 40 of the present invention, several examples were quantitatively analyzed by integrating Poison's equation. To simplify the analysis, it was assumed that the field emitter 38 possessed a temperature T=0° K., had an effective electron mass $m^*=0.2\ m_e$ (approximately the value of GaN), and contained a (N type) doping density $n=10^{19}\ cm^{-3}$ in the substrate region and n=0 in the graded electron affinity layer. All the calculations performed during the analysis were done assuming a one dimensional system and assuming zero emission current. Other calculations of the electronic structure of GaN and AlN indicate that the secondary minimum quantities (sometimes referred to as secondary minima) in the conduction band 18 of GaAlN are about 1 eV above the conduction band minimum. The effective mass approximation of the density of states was used, which approximation is valid when these materials comprising the layer 40 have a total accumulation potential below 1 eV. Results of these calculations are presented in FIGS. 4–9.

The operation of the field emitter 38 may be described with reference to FIGS. 4–9, each showing electron affinity values inside the surface layer 40 (negative positions, on the left of the 0 Angstrom position of the horizontal axis) and the vacuum level outside the layer 40 (positive positions, on the right of the 0 Angstrom position of the horizontal axis). The Fermi level 20 (see FIG. 3) is considered flat, with a value of zero (0) potential. For the sake of illustration, all the examples shown in FIGS. 4–9 are assumed to have a linearly graded electron affinity, that is, increases in the electron affinity from the substrate 42 to the surface 44 occur in a straight-line manner.

Figure 4:
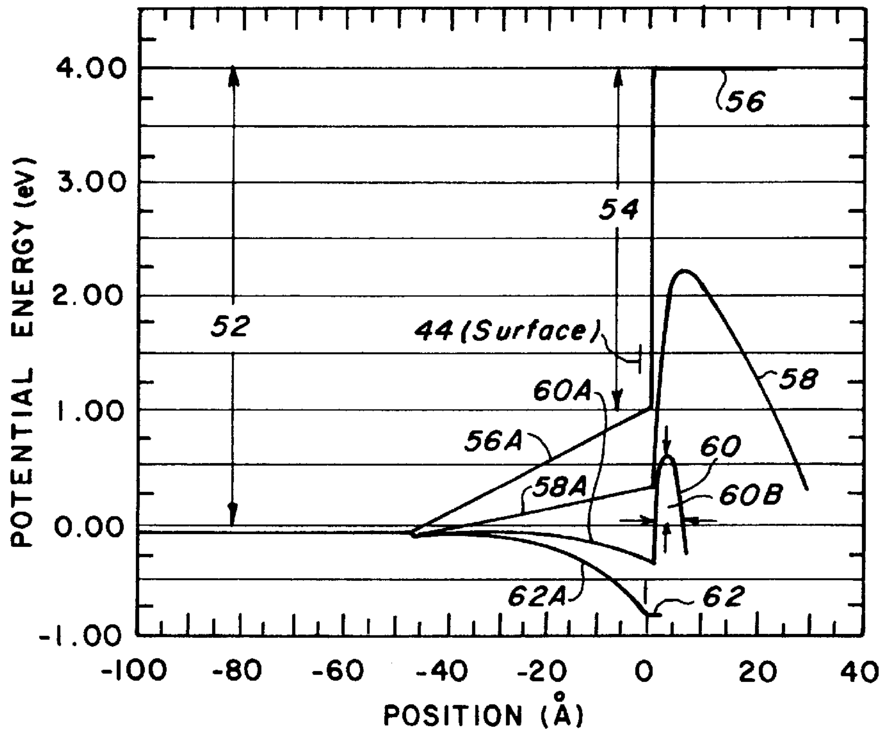
FIG. 4 illustrates potential energy profiles of the field emitter of the present invention having a graded electron affinity which varies linearly from 4 electron-Volts (eV) at the substrate to 3 eV at the surface, assuming several alternative specific electric fields exist in the vacuum at the surface.

FIG. 4 has a horizontal axis indicating the position (given in Angstroms) along the graded electron affinity layer 40 and a vertical axis indicating the potential energy, given in eV. Positions to the left of −50 Å on the horizontal axis indicate the substrate, whereas positions between −50 and 0 indicate the surface layer. The value of the electron affinity in the substrate 42 is about 4 eV as indicated by dimensional line 52, and the minimum value is 3 eV at surface 44 as indicated by dimensional lines 54 on FIG. 4.

FIG. 4 indicates the potential profiles 56, 58, 60, 62, created in response to several voltages applied at a remote anode (not shown), resulting in surface fields having values of 0, 1.0, 3.3, and $7.7\times10^7$ V/cm respectively. The potential profile 56 has a portion 56A which indicates the linear graded electron affinity in the presence of a zero (0) surface intensity field. More particularly, the portion 56A indicates that the graded electron affinity of the layer 40 increases linearly from 4 eV (that is, 0.00 on the vertical axis) to 3 eV (that is, 1.00 on the vertical axis). The potential profiles 58, 60, and 62 respectively have portions 58A, 60A and 62A each of which represent the bending (relative to sloped portion 52A) of the conduction band 18 of the layer 40 in response to the sequentially increasing external voltage. FIG. 4 further indicates a tunneling potential barrier 60B defined by the four directional arrows shown therefor. The tunneling potential barrier, known in the art, is of particular importance to the operation of field emitter 38 along the lines previously discussed with reference to FIG. 3.

FIG. 4 illustrates that if the surface electron affinity at the surface 44 is relatively high (e.g., 3 eV) and the electron affinity gradient in the layer 40 is not too large (approximately $20\times10^{-3}$ ev/Å (mev/Å)), the field emission process controls the emitted current density, as in a conventional field emitter, but the effective work function is reduced as manifested by the bending illustrated by the portions 58A, 60A and 62A of the potential profiles. The charge density at the surface 44 becomes significant for surface fields of approximately $2\times10^7$ V/cm (occurring between potential profiles 58 and 60). In this case the tunneling potential barrier 60B, that is, the barrier at the 0.00 potential indicated by the vertical axis, is still large enough to limit the emission current of the field emitter 38. However, because the tunneling barrier 60A at this point is low, the field emission probability is high. The surface charge density rises rapidly from zero to concentrations on the order of $10^{20}$ $cm^{-3}$ as the field is increased near $2\times10^7$ V/cm. Since the emitted current will rise according to both the surface charge density and the tunneling potential barrier 60A, the transconductance of the field emitter 38 made by using the graded electron affinity characteristic of the present invention, is significantly higher than the homogenous semiconductor field emitter 14 discussed with reference to FIG. 2, in which the surface charge density is not as strongly dependent on the external field and in which the tunneling barrier is relatively large. The increased transconductance provides a field emitter 38 that is particularly suited to produce modulated electron beams for electron beam devices.

The operating characteristics of the field emitter 38 may be further described with reference to FIG. 5.

Figure 5:
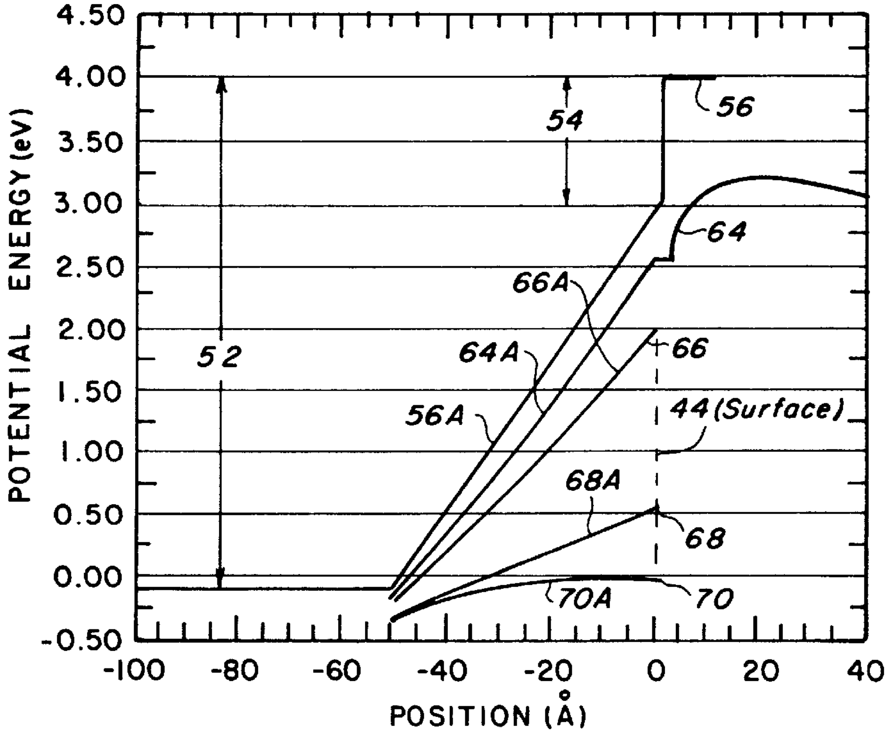
FIG. 5 illustrates potential energy profiles of the field emitter of the present invention having a graded electron affinity that varies linearly from 4 eV at the substrate to 1 eV at the surface, assuming several alternative specific electric fields exist in the vacuum at the surface.

FIG. 5 illustrates the property that if the surface electron affinity is selected to be low, and the electron affinity gradient in the layer is selected to be large, the electron transport process within the graded electron affinity layer will control the emission current completely.

FIG. 5 illustrates potential profiles 56, 64, 66, 68 and 70 within a field emitter 38 similar to that of FIG. 4, except that the field emitter 38 of FIG. 5 has a minimum electron affinity of 1 eV at the surface 44 as indicated by dimensional line 54. Potential profiles 64, 66, 68, 70 respectively correspond to surface fields having values of 0, 0.1, 1.0, 3.5 and $5.4\times10^7$ V/cm. Furthermore, as indicated in FIG. 5, the potential profile 56 now has a portion 56A representative of an electron affinity gradient (slope) of 60 mev/Å. The slope of portion 56A of FIG. 5 is about three (3) times greater than the slope of 56A of FIG. 4. The response of the potential profiles to applied voltage illustrated in FIG. 5 illustrates a situation in which the surface potential barrier for tunneling is much smaller than the potential barrier within the layer 40, causing the electron affinity gradient to limit the emission current, rather than tunneling as in traditional field emitters.

FIG. 5 indicates that as the intensity of the surface field is increased (for example 0.1 to $1.0\times10^7$ V/cm) the conduction bands represented by the rising portions (for example, 64A and 66A) of the potential profiles begin to bend downward in a manner as already described with reference to FIGS. 3 and 4.

For the field emitter 38 response illustrated in FIG. 5, an external electrical field of $5\times10^7$ V/cm (as shown near the peak portion of potential profile 70) is the minimum field that attracts the charge, located at the 0.00 potential indicated on the vertical axis, from within the substrate 42 of the field emitter 38 to the surface 44. However, the tunneling potential barrier vanishes at a lower applied electrical field (less than $1.0\times10^7$ V/cm). The vacuum potential is not shown in FIG. 5 for those situations in which the work function vanishes, e.g. for potential profiles 66, 68 and 70. It is not necessary for the surface electron affinity at the surface 44 to be zero or negative to obtain this situation, rather, such a situation may occur, as shown in FIG. 5, when the electron affinity of the surface 44 is +1 eV. In this case, the electron emission current is independent of small changes in the electron affinity of the surface 44 that may be induced by the adsorption/desorbtion of gases, discussed in the "Background" section. Thus, field emitter 38 having the parameters illustrated in FIG. 5 and not being influenced by surface non-uniformities created by adsorption/desorbtion of gases as discussed in the "Background" section, manifests a low noise and highly uniform operation.

Figure 6:
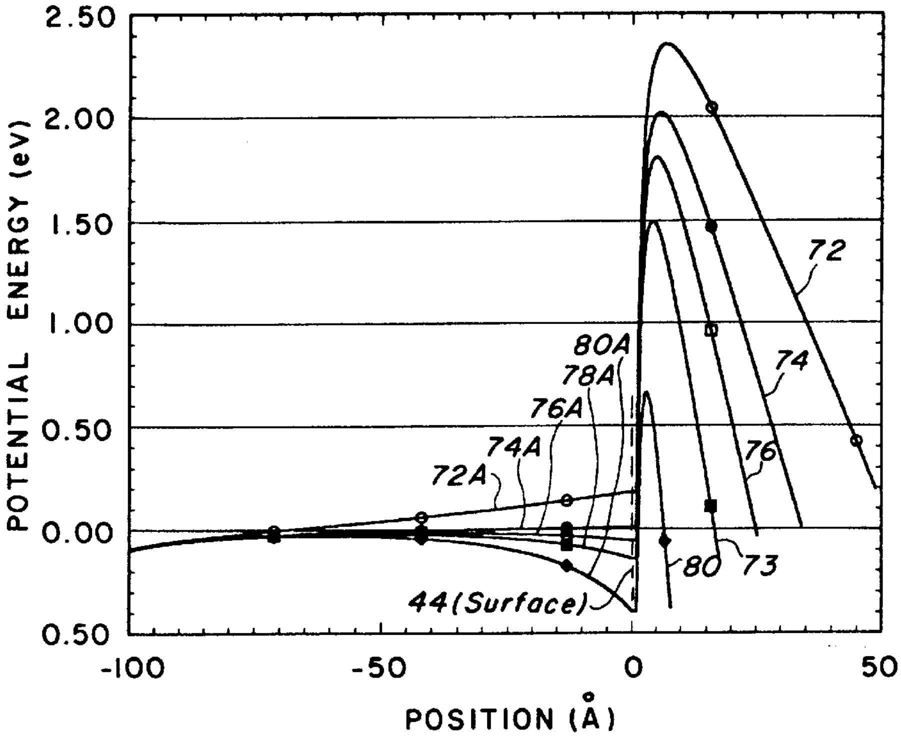
FIG. 6 illustrates potential energy profiles of the field emitter of the present invention having a graded electron affinity which varies linearly from 4 eV at the substrate to 3 eV at the surface and having a thickness twice of that of the field emitter of FIG. 4, assuming several alternative specific electric fields exist in the vacuum at the surface.
Figure 7:
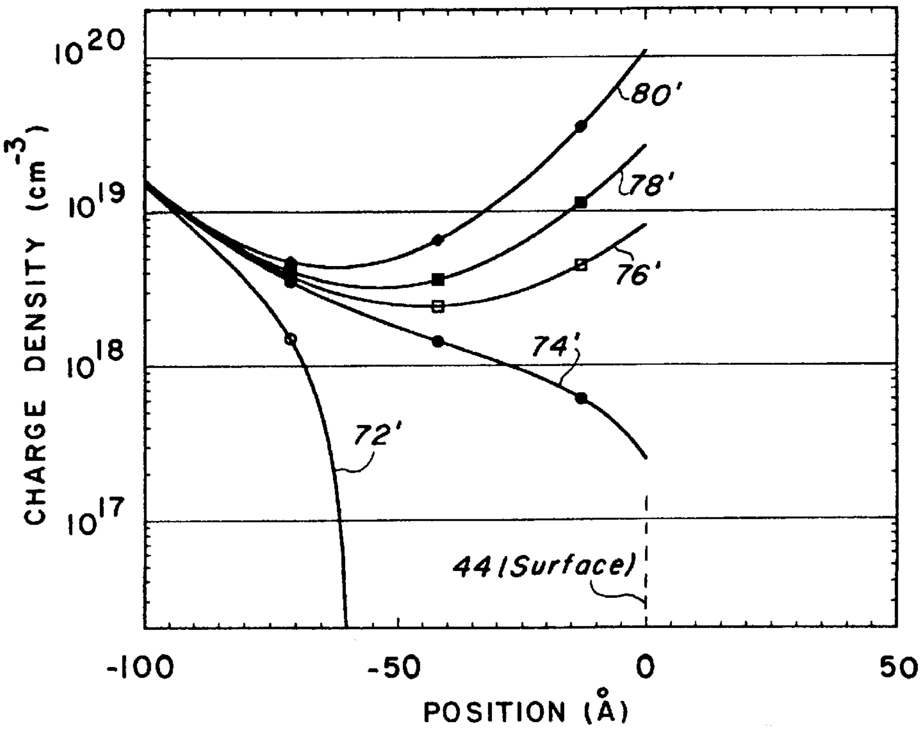
FIG. 7 illustrates charge density profiles of the field emitter of the present invention having a graded electron affinity which varies linearly from 4 eV at the substrate to 3 eV at the surface and having a thickness which is twice that of the device of FIG. 4, assuming several alternative specific electric fields exist in the vacuum at the surface.

Further operational parameters of the field emitter 38 may be further described with reference to FIGS. 6 and 7. FIGS. 6 and 7 illustrate the property that if the surface electron affinity is selected to be relatively high and the electron affinity gradient in the surface layer is not too large, the tunneling probability still controls the emitted current density as in a traditional cold field emitter.

FIG. 6 illustrates the response of field emitter 38 having a thickness of 100 Å and a graded electron affinity which varies from a maximum value of 4 eV at the substrate 42 to a minimum electron affinity value of 3 eV at the surface 44. FIG. 6 further illustrates the potential profiles 72, 74, 76, 78 and 80 respectively corresponding to surface fields having values of 0.60, 0.85, 1.13, 1.60, and $3.28\times10^7$ V/cm. The potential profiles 72, 74, 76, 78 and 80 have portions 72A, 74A, 76A, 78A and 80A that illustrate that the bending of the conduction band 18 correspondingly increases with increases in the strength or intensity of the surface field. FIG. 6 also illustrates that the lower electron affinity gradient (10 mev/Å) in the layer 40 allows charge to accumulate at the surface 44 for low field intensities, while the surface potential barrier to tunneling is still large. In this case moderate fields cause charge densities on the order of $10^{19}$ $cm^{-3}$ to accumulate at the surface before large emission currents are realized.

The surface charge densities related to the device of FIG. 6 may be further described with reference to FIG. 7.

Figure 8:
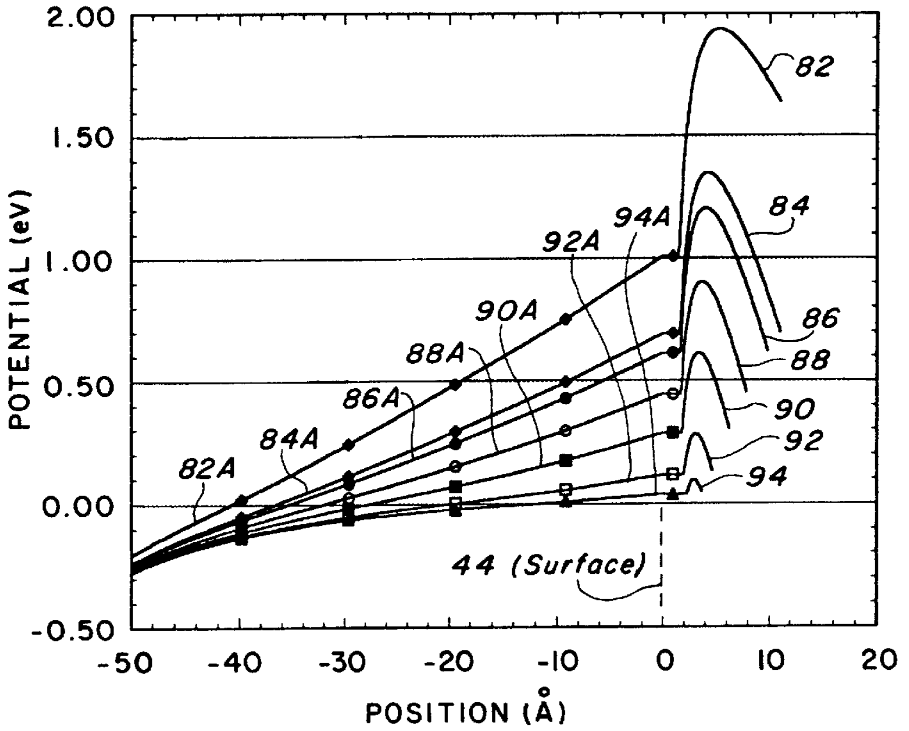
FIG. 8 illustrates potential energy profiles of the field emitter of the present invention having a graded electron affinity which varies linearly from 4 eV at the substrate to 2 eV at the surface, assuming several alternative specific electric fields exist in the vacuum at the surface.
Figure 9:
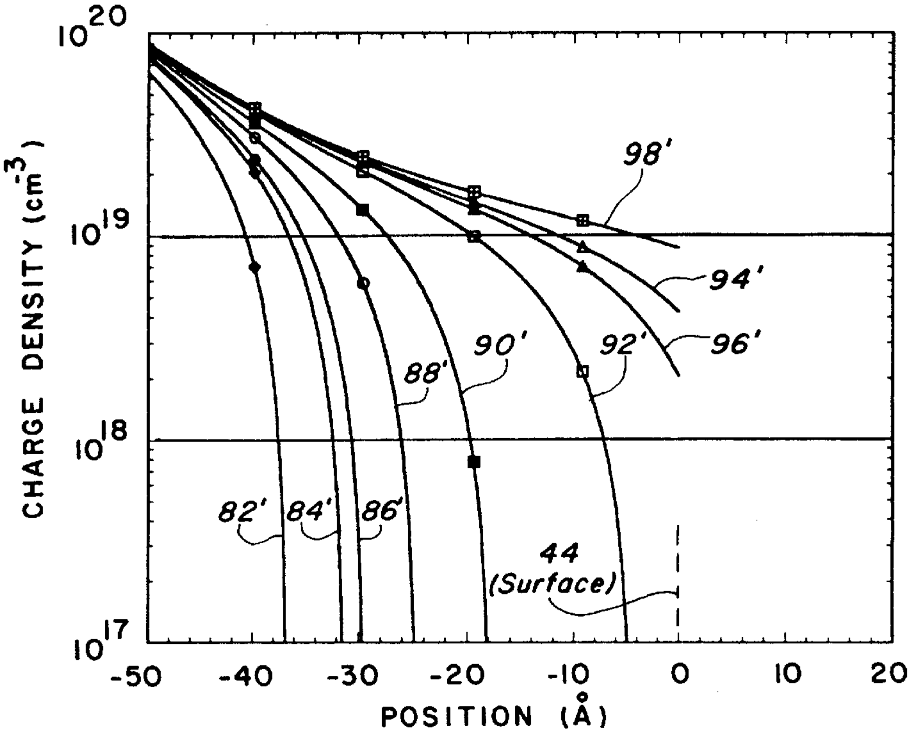
FIG. 9 illustrates charge density profiles of the field emitter of the present invention having a graded electron affinity which varies linearly from 4 eV at the substrate to 2 eV at the surface, assuming several alternative specific electric fields exist in the vacuum at the surface.

FIG. 7 illustrates plots 72', 74', 76', 78', and 80', respectively having the same surface fields as plots 72, 74, 76, 78 and 80, respectively of FIG. 6. More particularly, the creation of the potential profiles 72, 74, 76, 78 and 80 correspondingly cause the charge densities (given in $cm^{-3}$ indicated by plots 72', 74', 76', 78' and 80'. FIG. 7 illustrates that a large surface density ($10^{20}$ $cm^{-3}$) is available for field emission, such as that represented by the uppermost portion of plot 80'. However, FIG. 7 further indicates that the field emission current may be somewhat limited in some cases by electron transport through layer 40, since the charge density falls into the $10^{18}$ $cm^{-3}$ range at about 60 Å below the surface 44. Further details of the operation of the field emitter 38 may be described with a simultaneous reference to FIGS. 8 and 9. FIGS. 8 and 9 illustrate the property that if the surface electron affinity is selected so that the tunneling potential barrier remains positive but becomes very low at the surface field where charge first appears at the surface, then the emission current is controlled by a combination of the electron transport process and the tunneling probability.

FIGS. 8 and 9 illustrate the potential profiles and the surface charge densities, respectively, for a field emitter 38 having a thickness of 50 Å and a graded electron affinity that varies from a maximum value of 4 eV at the substrate 42 to a minimum value of 2 eV at the surface 44. FIG. 8 illustrates the potential profiles 82, 84, 86, 88, 90, 92 and 94 corresponding to surface field intensities of 1.0, 1.56, 1.72, 2.06, 2.42, 2.91 and $3.27\times10^7$ V/cm. FIG. 9 illustrates the surface charge densities (given in $cm^{-3}$) as having plots 82', 84', 86', 88', 90', 92', 94', 96' and 98'. The potential profiles 82, 84, 86, 88, 90, 92 and 94 create the charge densities indicated by plots 82', 84', 86', 88', 90', 92' and 94'. Further, the surface charge densities illustrated by plots 96' and 98' are created by the fields having intensities of 3.18 and $3.42\times10^7$ V/cm, respectively. As seen in FIG. 8, the tunneling potential barrier indicated by the upper half portions of the peaks of plots 82–94 becomes very low at the same fields required to attract charge to the surface (i.e. $3.27\times10^7$ V/cm). Thus both the surface charge and the tunneling probability are changing extremely rapidly just as emission starts to occur, causing a rapid change in the emission current and a larger transconductance relative to the cases illustrated in FIGS. 4, 5, and 6.

Another feature of the present invention is an improved ability to limit the range of energies at which electrons are emitted. This feature can be appreciated from FIG. 8. In the case of the potential profile 94A, the minimum energy of the emitted electrons will be just greater than the zero energy. The maximum energy of the emitted electrons will not be significantly larger than the top of the potential energy barrier for profile 94, which is about 0.1 eV. Thus, the range of emitted energies will be less than approximately 0.1 eV. This range is small relative to the range expected from prior art semiconductor and metal field emitters, which range may be over 0.5 eV for surface fields sufficient to produce high current densities approaching $10^8$ A/cm$^2$. A small range of emitted electron energies is advantageous for applications which require a well focussed beam, especially when the beam voltage is to be kept low, for example less than 100V.

It should now be appreciated that the practice of the present invention provides for field emitters having reduced extraction voltage, increased transconductance, reduced noise, reduced range of emission energies, and improved limits on the maximum emission current and current density.

The values of the electron affinity of layer 40 may be selected to provide and adjust an electron affinity profile to accomplish various desired results. More particularly, the electron affinity profile may be adjusted to increase, relative to prior art field emitters, the ratio of emitted current to the voltage applied to the extraction electrode 16 over a given range of emission current or current density to thereby increase the transconductance at that current density. Similarly, the electron affinity profile may be adjusted to reduce the maximum emission current. Further, the electron affinity profile may be defined during the deposition process. Moreover, the electron affinity profile may be adjusted to reduce the impact of changes in the electron affinity at the surface (e.g. due to adsorption) on the emission properties, thereby reducing emission noise and increasing emission uniformity from emitter to emitter within an array.

The electron affinity profile of layer 40 may be adjusted to produce zero or lower emission current at a significant surface electric field just less than that where large emission currents are desired. Moreover, the electron affinity profile of layer 40 may be adjusted to produce emission current vs. voltage characteristics which are different from the functional form of the Fowler-Nordheim equation, in particular, linear characteristics or characteristics approaching a step function.

Fabrication Of The Field Emitter Of The Present Invention

In one embodiment, the surface layer 40 may be formed of gallium aluminum nitride, $Ga_{1-x}Al_xN$ alloy which allows for its growth using any value of x. Further, a low electron affinity may be realized for compositions where x is near 1, because AlN may have a low or negative electron affinity, as more fully described in the technical article "Observation of a Negative Electron Affinity for Heteroepitaxial AlN on a (6H—SiC (0001))" of M. C. Benjamin et al. published in Applied Physics Letters 64 3388-3290 (1994), and herein incorporated by reference. The electron affinity of the $Ga_{1-x}Al_xN$ alloys may be arranged to change from low values at high Al mole fractions to moderate positive values at high Ga mole fractions. The composition of $Ga_{1-x}Al_xN$ is selected so as to provide for minimum and maximum electron affinity quantities that are established by the selection of the mole fractions of the Ga and Al elements. For example, to provide for an electron affinity value of 0 eV the mole fraction of Al may be selected to be of an amount 1 and the mole fraction of Ga may be selected to be of an amount 0. Further, to provide for an electron affinity value of approximately 3 eV the mole fraction of the element Al may be selected to be 0 and the mole fraction of the element Ga may be selected to be of a value 1.

The semiconductor material for the layer 40 may also be selected from the group comprising $Ga_xAl_{1-x}N$, $In_xAl_{1-x}N$ and $Ga_xIn_yAl_{1-x-y}N$. These specific alloys may be further selected to have a crystal structure of either zincblende or wurtzite, known in the art. The mole fraction(s) x and y are varied, in a manner similar to those already described for $Ga_xAl_{1-x}N$, in order to change the electron affinity to obtain a desired profile thereof.

The variation in the electron affinity may be accomplished during the deposition process of the surface layer 40. GaAlN may be grown epitaxially onto GaAs, SiC, or sapphire substrates using Organo-Metallic Vapor Phase Epitaxy (OMVPE) or Molecular Beam Epitaxy (MBE) or other deposition means known in the art. The Ga and Al mole fractions may be adjusted accurately and continuously using these techniques so that a selected electron affinity profile is produced. A process that may be used in fabrication of the substrate structure 42 is described in the technical article, "Field Emission from GaAs Pyramids Fabricated Using Selected Area Vapor Phase Epitaxy" of J. L. Shaw et al. included in the Abstracts of the July 1995 International Vacuum Microelectronics Conference, and herein incorporated by reference.

The semiconductor material selected for the layer 40 need not be doped, but may be doped either n-type or p-type; especially at the interface between the substrate 42 and layer 40. This doping advantageously promotes the formation of an ohmic contact therebetween. The electron affinity of the semiconductor material at the bottom or lowermost portion of layer 40; i.e., at the interface 48 between layer 40 and the underlying substrate 42, is selected to be preferably equal to or close to the electron affinity or work function of the underlying substrate 42. Such a match provides a low resistance to form therebetween and allows the free flow of electrons in both directions across the interface therebetween.

The layer 40 may be selected from the group comprising amorphous, polycrystalline, and crystalline, and consequently may be deposited onto a substrate 42 which is selected from the group comprising amorphous, polycrystalline and crystalline.

High Speed Application Of The Field Emitter Of The Present Invention

In some modes of operation, that is, in cases where the emission is mainly limited by the tunneling probability, the graded electron affinity field emitter 38 behaves in substantially the same manner as a traditional field emitter having the work function and electron concentration produced at the surface 44 of the graded electron affinity layer 40. In other modes of operation, that is, when the electron emission is limited by the current density which can be transported through the graded electron affinity layer 40 to a greater degree than a homogeneous semiconductor, the transit time associated with that electron transport may limit the maximum modulation frequency. However, it is estimated that by proper design, that is, by keeping the thickness of the graded affinity layer 40 relatively small (e.g., less than about 50 Å) and by keeping the affinity gradient large (e.g., greater than about 60 meV/Å), the electron transit times within the graded electron affinity layer 40 may be kept short enough to prevent serious performance loss, i.e., the transit times might be made as short as ten picoseconds. Conversely, the electron affinity gradient of layer 40 of the present invention may be made relatively small and the graded affinity layer 40 made relatively thick, thereby increasing the transit time to the nanosecond range or longer, in order to produce field emission at low electric fields in applications which require lower frequency response.

It is further estimated that the concentration of electrons traveling through the layer 40 may be varied from negligible values to values exceeding $10^{20}$ $cm^{-3}$, allowing emission current densities from zero to more than $10^7$ $A/cm^2$. Failures may occur in FEAs when the emitted current density becomes large enough to produce a significant concentration of charge in space between the surface 44 and anode (not shown). For standard field emitters, this current density is approximately $10^8$ $A/cm^2$. Since the current emitted from the field emitter described herein may be limited by the velocity and concentration of charge moving in the layer 40, the present invention provides for limiting the maximum current density, current emission, and/or energy range to desirable values.

Structure Consideration Of The Field Emitter Of The Present Invention

In some cases, and with reference to FIG. 1, current may be disadvantageously emitted from the sides of a field emitter structure (such as a cone, pyramid, or edge), in addition to the advantageous current emitted from the top or apex of the structure. This phenomenon is often detrimental to the operation of the device because the current emitted from the sides of the emitter structures is often intercepted by the extraction electrode 16, rather than passing through the aperture 16A of the extraction electrode as is typically desired. This current interception is undesirable since it will increase the energy required to drive the extraction electrode 16 and will deposit that extra energy in the extraction electrode 16. The consequences of the current interception may be particularly severe if atoms or molecules are desorbed from the surface of the extraction electrode 16 as a result of the electron interception, since the atoms or molecules may be positively charged, either upon desorbtion or upon subsequent interactions with other electrons, and the positively charged species thus formed will be attracted toward the field emitter structure 14 or 42, where they are likely to produce heat, cause the release of surface atoms, and cause the release of additional electrons by the secondary emission process. These effects may cause long term wear of the field emitter 38, and may lead to the formation of an arc, which can deposit sufficient energy in either the extraction electrode 16 or the emitter structure, or both to suddenly and permanently damage the field emitter 38.

Because of the small radius of curvature at the apex, the electric field caused by the positive voltage applied to the extraction electrode 16 with respect to the field emitter structure is generally much larger at the sharp apex of the field emitter structure than at the smooth sidewall surfaces, so that the vast majority of field emission originates at the apex of the layer 40 of the field emitter 38. However, when the emission current density exceeds approximately $10^8$ $A/cm^2$ there is sufficient space charge near the field emitting surfaces to reduce the field relative to the field which would occur in the absence of electron emission. Thus when the emission current density at the apex exceeds $10^8$ $A/cm^2$, a relatively large field may occur at the emitter side walls and field emission from those surfaces can result. Since the electrons emitted from the sidewalls is more likely to be intercepted by the extraction electrode 16, resulting in detrimental effects, it is desirable to avoid this sidewall emission.

The present invention can be used to avoid sidewall emission in several ways. One way is to produce an electron affinity profile in layer 40 which limits the maximum emission current densities to less than $10^8$ $A/cm^2$. Another way is to fabricate the graded affinity layer 40 only on the apex of the field emitter. This might be accomplished using a method similar to the selected area epitaxy technique, in which the substrate growth would be stopped short of the formation of sharp pyramids, and then would be continued with the graded affinity material to complete the pyramid. Details of the desired technique may be obtained from a review of the previously incorporated by reference technical article of J. Shaw et al. Another way is to take advantage of the relatively large thickness of the graded affinity layer along the vertical direction at the apex of a conical or pyramidal emitter relative to the directions normal to the surface of the emitter. If a graded composition semiconductor material is grown onto a pyramidal substrate in such a way as to preserve the pyramidal shape, the material will be thicker and the electron affinity gradient will be smaller in the vertical direction at the tip apex than in the directions normal to the smooth sidewalls. The geometry of the tip apex is generally illustrated in FIG. 1 and the desired thicknesses in the vertical and normal direction of this embodiment of the present invention may be envisioned therefrom. Since a lower electron affinity gradient leads to emission at lower surface fields, significantly larger fields will have to occur at the sidewalls than at the tip apex to produce similar current densities. Thus even when emission currents exceeding $10^8$ $A/cm^2$ occur at the tip apex, emission from the sidewalls will not start until significantly larger voltages are applied to the extraction electrode 16, allowing simpler and superior control of the sidewall emission problem relative to conventional emitter surfaces.

In addition to improved lifetime and reduced failures, the relatively large emission current expected at the tip apex due to the geometry effect is expected to have advantages in improved source brightness and consequently improved quality of electron beams generated using field emitters having graded electron affinity surface layers.

The foregoing descriptions of the preferred embodiments are intended to be illustrative and not limiting. Numerous modifications and variations can be made within the purview of the claimed invention without departing from the spirit or scope of the present invention. It is therefore to be understood that within the scope of the appended claims the invention may be practiced otherwise than as specifically described.

What is claimed is:

1. A field emitter comprising:

(a) a substrate of a material whose composition is selected to provide a first value of electron affinity; and (b) a layer of material having a selected thickness and on the surface of said substrate, said layer having a graded structure being of a composition selected to establish an electron affinity profile from the substrate interface to its surface, said profile being defined by the variation of said electron affinity from said substrate interface to said surface wherein said graded affinity structure promotes the attraction of electrons from the substrate to the surface via the bending of the conduction band of the graded affinity structure downward.

2. The field emitter according to claim 1, wherein the portion of said layer near said substrate interface is doped.

3. The field emitter according to claim 1, wherein said layer is selected from the group comprising amorphous, crystalline, and polycrystalline and is fabricated on said substrate that is selected from the group comprising amorphous, polycrystalline and crystalline.

4. The field emitter according to claim 1, wherein a lowermost portion of said layer has an electron affinity which is substantially equal to said electron affinity of said substrate.

5. The field emitter according to claim 1, wherein said electron affinity profile is adjusted to increase the ratio of the emitted current to the voltage applied to an extraction electrode over a selected range of emission current.

6. The field emitter according to claim 1, wherein said electron affinity profile is adjusted to increase the ratio of the emitted current to the voltage applied to an extraction electrode over a selected range of emission current density.

7. The field emitter according to claim 1, wherein said electron affinity profile is adjusted to increase the electric field at the surface of a field emitter for a selected emission current.

8. The field emitter according to claim 1, wherein said electron affinity profile is adjusted to limit the maximum emission current.

9. The field emitter according to claim 1, wherein said electron affinity profile is adjusted to reduce said electron affinity at the surface of the field emitter.

10. The field emitter according to claim 1, wherein said electron affinity profile is adjusted to reduce emission noise.

11. The field emitter according to claim 1, wherein said electron affinity profile is adjusted to improve the uniformity of emitting surfaces.

12. The field emitter according to claim 1, wherein said electron affinity profile is adjusted to reduce the total current emitted from the sides of a field emitting structure relative to an apex of the emitting structure.

13. The field emitter according to claim 1, wherein said electron affinity profile is adjusted to produce low or zero emission current at a significant surface electric field just less than that where large emission currents are desired.

14. The field emitter according to claim 1, wherein said electron affinity profile is adjusted to produce emission current vs. voltage characteristics which approach a step function.

15. The field emitter according to claim 1, wherein said layer is $Ga_{1-x}Al_xN$, wherein x is selected to vary with thickness so as to provide a desired electron affinity profile.

16. The field emitter according to claim 1, wherein said layer is a material selected from the group comprising $Ga_xAl_{1-x}N$, $In_xAl_{1-x}N$, and $Ga_xIn_yAl_{1-x-y}N$, wherein x and y are selected to vary with thickness so as to provide a desired electron affinity profile.

17. The field emitter of claim 1, wherein said profile is adjusted to produce a narrow energy distribution of emitted electrons.

* * * * *